United States Patent
Chung

(10) Patent No.: US 9,000,813 B2
(45) Date of Patent: *Apr. 7, 2015

(54) WAVEFORM GENERATION CIRCUIT

(75) Inventor: Kyu-Young Chung, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/459,538

(22) Filed: Apr. 30, 2012

(65) Prior Publication Data

US 2012/0212263 A1 Aug. 23, 2012

Related U.S. Application Data

(62) Division of application No. 12/835,532, filed on Jul. 13, 2010, now Pat. No. 8,188,772.

(30) Foreign Application Priority Data

Dec. 23, 2009 (KR) .................. 10-2009-0130238

(51) Int. Cl.
  *H03K 4/06* (2006.01)
  *H03K 4/501* (2006.01)
  *H03K 4/90* (2006.01)
  *H03K 5/00* (2006.01)

(52) U.S. Cl.
  CPC ...... *H03K 4/501* (2013.01); *H03K 4/90* (2013.01); *H03K 2005/00104* (2013.01)

(58) Field of Classification Search
  USPC .................. 327/131, 132, 134, 135, 137, 140
  See application file for complete search history.

(56) References Cited

U.S. PATENT DOCUMENTS

| | | | |
|---|---|---|---|
| 5,394,020 A * | 2/1995 | Nienaber | 327/140 |
| 6,819,154 B2 * | 11/2004 | Greenfeld | 327/172 |
| 7,573,250 B2 | 8/2009 | Clavette | |
| 7,746,129 B2 * | 6/2010 | Choi et al. | 327/131 |
| 7,746,130 B2 | 6/2010 | Chang | |
| 8,188,772 B2 * | 5/2012 | Chung | 327/131 |
| 2006/0043956 A1 | 3/2006 | Clavette | |

FOREIGN PATENT DOCUMENTS

| | | |
|---|---|---|
| JP | 10-112810 A | 4/1998 |
| KR | 10-2005-0121943 A | 12/2005 |
| KR | 10-2006-0050623 A | 5/2006 |
| KR | 10-2008-0034687 A | 4/2008 |

* cited by examiner

*Primary Examiner* — Hai L Nguyen
(74) *Attorney, Agent, or Firm* — NSIP Law

(57) ABSTRACT

Waveform generation circuits are provided. A waveform generation circuit includes a waveform generation block configured to generate a waveform signal corresponding to a driving control signal, and a control signal generation block configured to generate the driving control signal to compensate the waveform signal for an environmental factor affecting the waveform generation circuit.

11 Claims, 11 Drawing Sheets

INITIAL OPERATION PERIOD

NORMAL OPERATION PERIOD

WAVEFORM GENERATION CIRCUIT

CROSS-REFERENCE TO RELATED APPLICATIONS

The present application is a Division of U.S. application Ser. No. 12/835,532, filed on Jul. 13, 2010 now U.S. Pat. No. 8,188,772, which claims the benefit under 35 U.S.C. §119(a) of Korean Patent Application No. 10-2009-0130238 filed on Dec. 23, 2009, the entire disclosure of which is incorporated herein by reference for all purposes.

BACKGROUND

1. Field

The following description relates to a technology for designing a semiconductor, and, for example, to a waveform generation circuit for generating a predetermined waveform.

2. Description of Related Art

In general, diverse circuits for performing diverse operations are provided inside of a semiconductor memory device, including a double data rate synchronous Dynamic Random Access Memory (DDR SDRAM) device. Among the circuits is a waveform generation circuit which generates a predetermined waveform. Examples of waveforms generated in a waveform generation circuit include sine waves, square waves, ramp waves, pyramidal waves, sawtooth waves and the like.

FIG. 1 is a circuit diagram illustrating an example of a general sawtooth wave generation circuit. Referring to FIG. 1, a sawtooth wave generation circuit includes a current source IS for generating a reference current I_REF, a capacitor C for being charged with the reference current I_REF, and an NMOS transistor NM for discharging capacitor C to a discharge terminal V_GND by being turned on in response to a pulse signal PUL.

FIG. 2 is a waveform diagram illustrating an example of a circuit operation of the sawtooth wave generation circuit illustrated shown in FIG. 1. Referring to FIGS. 1 and 2, a pulse signal PUL is a signal having a short pulse width and a predetermined period T. The NMOS transistor NM is turned on according to the period T. First, when the NMOS transistor NM is turned off, the capacitor C is charged with the reference current I_REF, and the slope of a sawtooth waveform signal S_OUT is determined based on the extent of charging. FIG. 2 shows a sawtooth waveform signal S_OUT generated when the waveform generation circuit of FIG. 1 operates as intended. Herein, the slope of the sawtooth waveform signal S_OUT is defined by the reference current I_REF and a capacitance of the capacitor C. Subsequently, when the NMOS transistor NM is turned on, the capacitor C is discharged to terminal V_GND.

However, it is substantially difficult to realize the desirable sawtooth waveform signal S_OUT in a conventional circuit structure. This is because the environmental factors reflected in the waveform generation circuit, such as, a process, a power source voltage, temperature and so forth, may be different, and these factors affect the slope of the sawtooth waveform signal S_OUT. For instance, when the amount of the reference current I_REF is changed according to the environmental factors reflected in a circuit, when the capacitance of the capacitor C is changed, when the size of parasitic capacitance of the NMOS transistor NM is changed, the target waveform and slope of a sawtooth waveform signal S_OUT may be changed. After all, the sawtooth waveform signal S_OUT does not maintain a uniform slope due to the environmental factors reflected in the circuit.

Sawtooth waveform signals S_OUT are usually used in circuits that are controlled in analog. In such circuits, the slope of the sawtooth waveform signals S_OUT is determined to achieve a particular result and when the waveform changes from the desired slope, the result cannot be achieved. Therefore, it is required to develop a circuit that may generate sawtooth waveform signals S_OUT having a uniform slope all the time in order to acquire the resultant object of a desired waveform.

SUMMARY

In one general aspect, there is provided a waveform generation circuit, including a waveform generation block configured to generate a waveform signal corresponding to a driving control signal, and a control signal generation block configured to generate the driving control signal to compensate the waveform signal for an environmental factor affecting the waveform generation circuit.

The general aspect of the waveform generation circuit may further provide that the control signal generation block receives feedback from the waveform signal.

The general aspect of the waveform generation circuit may further provide that the waveform signal includes a slope corresponding to the driving control signal.

The general aspect of the waveform generation circuit may further provide that the waveform signal includes a sawtooth waveform.

The general aspect of the waveform generation circuit may further provide that the waveform generation block includes a variable current generation unit, a charging unit, and a discharging unit, the variable current generation unit being configured to generate a current corresponding to the driving control signal, the charging unit being configured to be charged with the current generated in the variable current generation unit, the discharging unit being configured to discharge the charging unit.

The general aspect of the waveform generation circuit may further provide that the waveform generation block includes a voltage comparison unit, a charging unit, and a switching unit, the voltage comparison unit including a first input and a second input, the first input being coupled to the driving control signal, the second input being coupled to a discharge terminal, the charging unit being configured to be coupled between an output terminal and the first input terminal of the voltage comparison unit, the switching unit being configured to be coupled with the charging unit in parallel, the switching unit being configured to perform a switching operation at a predetermined period, the voltage comparison unit being configured to generate the waveform signal by comparing voltage levels at the first input and the second input.

The general aspect of the waveform generation circuit may further provide a pulse generation block configured to generate a pulse signal enabled corresponding to the period of the waveform signal, and input the generated pulse signal into the waveform generation block.

In another general aspect, there is provided a waveform generation circuit, including a waveform generation block configured to generate a waveform signal corresponding to a driving current, a voltage comparison block configured to compare a voltage level of the waveform signal with a reference voltage defined based on a target voltage level of the waveform signal, and a driving current control block configured to generate a driving control signal corresponding to an output signal of the voltage comparison block, and control the driving current based on the driving control signal.

Another general aspect of the waveform generation circuit may further provide that the waveform signal includes a slope corresponding to the driving control signal.

Another general aspect of the waveform generation circuit may further provide that the waveform signal includes a sawtooth waveform.

Another general aspect of the waveform generation circuit may further provide that the voltage comparison block includes a first voltage comparison unit and a second voltage comparison unit, the first voltage comparison unit being configured to compare the voltage level of the waveform signal with a first reference voltage to thereby output a first comparison signal, the second voltage comparison unit being configured to compare the voltage level of the waveform signal with a second reference voltage to thereby output a second comparison signal.

Another general aspect of the waveform generation circuit may further provide that the first reference voltage corresponds to a voltage level that is less than the target voltage level, and the second reference voltage corresponds to a voltage level that is greater than the target voltage level.

Another general aspect of the waveform generation circuit may further provide that a current amount of the driving current increases in response to the first comparison signal, and the current amount of the driving current decreases in response to the second comparison signal.

Another general aspect of the waveform generation circuit may further provide that the waveform generation block includes a variable current generation unit, a charging unit, and a discharging unit, the variable current generation unit being configured to generate the driving current corresponding to the voltage level of the driving control signal, the charging unit being configured to be charged with the driving current generated in the variable current generation unit, the discharging unit being configured to discharge the charging unit.

Another general aspect of the waveform generation circuit may further provide that the waveform generation block includes a voltage comparison unit, a charging unit, and a switching unit, the voltage comparison unit including a first input and a second input, the first input being coupled to the driving control signal, the second input being coupled to a discharge terminal, the charging unit being configured to be coupled between an output terminal and the first input terminal of the voltage comparison unit, the switching unit being configured to be coupled with the charging unit in parallel, the switching unit being configured to perform a switching operation, the voltage comparison unit being configured to generate the waveform signal by comparing voltage levels at the first input and the second input.

Another general aspect of the waveform generation circuit may further provide a pulse generation block configured to generate a pulse signal enabled corresponding to a period of the waveform signal, and input the generated pulse signal into the waveform generation block.

Other features and aspects may be apparent from the following detailed description, the drawings, and the claims.

Figure 1:
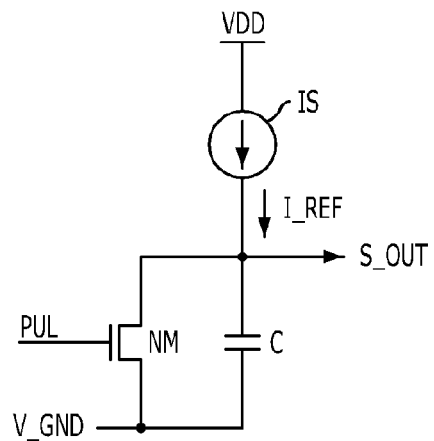
FIG. 1 is a circuit diagram illustrating an example of a general sawtooth wave generation circuit.
Figure 2:
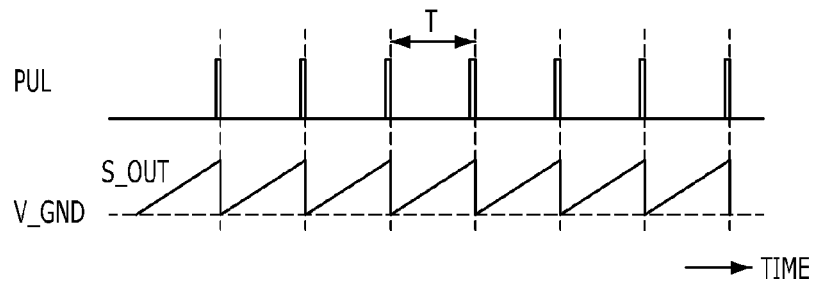
FIG. 2 is a waveform diagram illustrating an example of a circuit operation of the sawtooth wave generation circuit illustrated shown in FIG. 1.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. In addition, descriptions of well-known functions and constructions may be omitted for increased clarity and conciseness.

It is understood that the features of the present disclosure may be embodied in different forms and should not be construed as limited to the example embodiment(s) set forth herein. Rather, embodiment(s) are provided so that this disclosure will be thorough and complete, and will convey the full scope of the present disclosure to those skilled in the art. The drawings may not be necessarily to scale, and, in some instances, proportions may have been exaggerated in order to clearly illustrate features of the embodiment(s). When a first layer is referred to as being "on" a second layer or "on" a substrate, it may not only refer to a case where the first layer is formed directly on the second layer or the substrate but may also refer to a case where a third layer exists between the first layer and the second layer or the substrate.

Figure 3:
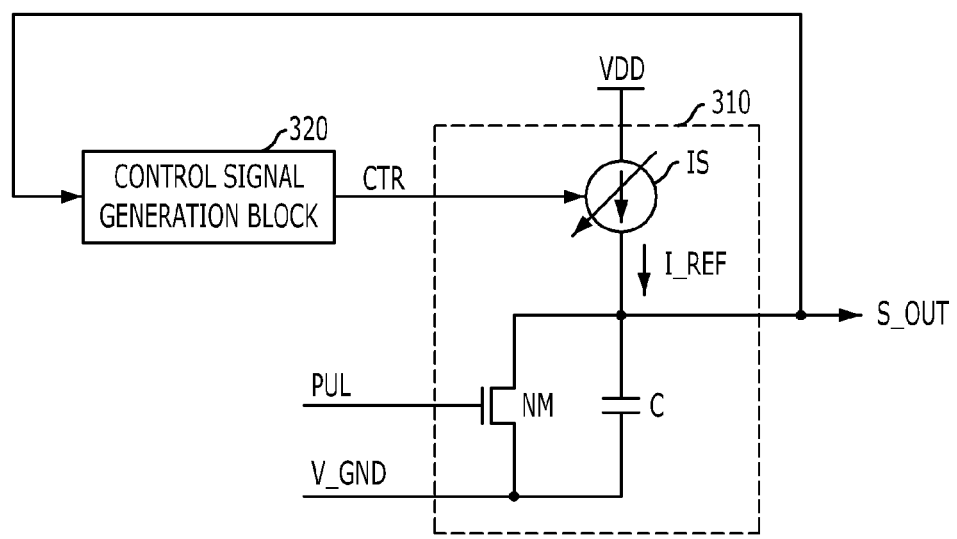
FIG. 3 is a circuit diagram illustrating an example embodiment of a waveform generation circuit.

FIG. 3 is a circuit diagram illustrating an example embodiment of a waveform generation circuit. The waveform generation circuit as illustrated in FIG. 3 a waveform generation block 310 and a control signal generation block 320.

The waveform generation block 310 generates a sawtooth waveform signal S_OUT in response to a driving control signal CTR. The waveform generation block 310 includes a variable current generation unit IS for generating a current in response to the driving control signal CTR, a charging unit C for being charged with the current generated in the variable current generation unit IS, which will be referred to as a driving current hereafter, and a discharging unit NM for discharging the charging unit C periodically. Herein, the variable current generation unit IS may be formed of a current source connected between a power source voltage terminal VDD and an output terminal outputting the sawtooth waveform signal S_OUT. The charging unit C may be formed of a capacitor connected between the output terminal and a discharge terminal V_GND. The discharging unit NM may be formed of an NMOS transistor which has a source-drain path between the output terminal and the discharge terminal V_GND and receives a pulse signal PUL through a gate. Hereafter, the same reference numerals will be given to the same corresponding constituent elements.

The control signal generation block 320 compensates the sawtooth waveform signal S_OUT for environmental factors. The waveform generation circuit fabricated according to an example embodiment features receiving feedback on the sawtooth waveform signal S_OUT in order to adjust for environmental factors affecting the sawtooth waveform signal S_OUT.

Hereafter, an operation of the waveform generation block 310 will be briefly described. Herein, a pulse signal PUL is a signal having a short pulse width and a predetermined period T, and an NMOS transistor NM is turned on based on the period T. First of all, when the NMOS transistor NM is turned off, a capacitor C is charged with charges corresponding to a driving current. The slope of the sawtooth waveform signal S_OUT is determined based on the extent of the charging. In this example embodiment, the amount of driving current is controlled by a driving control signal CTR. In other words, the sawtooth waveform signal S_OUT has a slope corresponding to the driving control signal CTR. Meanwhile, when the NMOS transistor NM is turned on, charges on the capacitor C are discharged to terminal V_GND.

Although it will be described again later on, this example embodiment receives feedback from the sawtooth waveform signal S_OUT and performs a compensation operation. Therefore, although the amount of reference current I_REF may be changed according to the environmental factors, the amount of the capacitor C may be changed, and/or the size of a parasitic capacitance of the NMOS transistor NM may be changed, it is possible to generate sawtooth waveform signals S_OUT of a uniform slope all the time.

Figure 4:
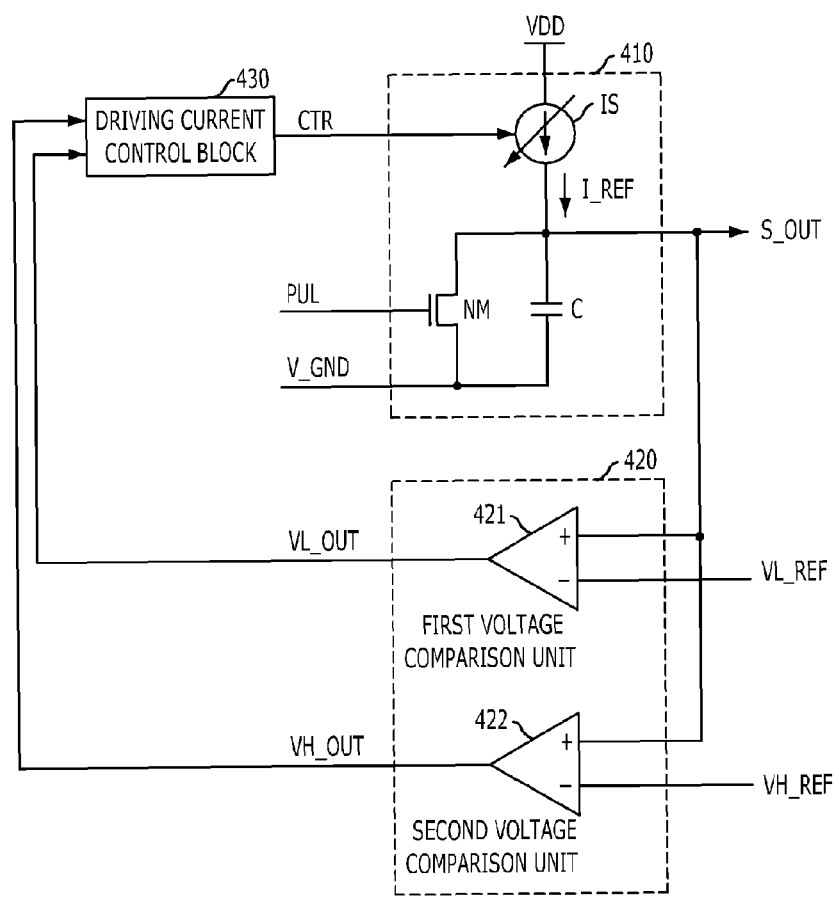
FIG. 4 is a circuit diagram illustrating another example embodiment of a waveform generation circuit.

FIG. 4 is a circuit diagram illustrating another example embodiment of a waveform generation circuit. The waveform generation circuit as illustrated in FIG. 4 includes a waveform generation block 410, a voltage comparison block 420, and a driving current control block 430. The waveform generation block 410 has the same structure as the waveform generation block 310 shown in FIG. 3, and it generates a sawtooth waveform signal S_OUT in response to a driving current.

The voltage comparison block 420 compares the levels of a first reference voltage VL_REF and a second reference voltage VH_REF defined in response to a target voltage level of the sawtooth waveform signal S_OUT with the voltage level of the sawtooth waveform signal S_OUT, and the voltage comparison block 420 includes a first voltage comparison unit 421 and a second voltage comparison unit 422. Herein, the first voltage comparison unit 421 compares the voltage level of the sawtooth waveform signal S_OUT with the first reference voltage VL_REF to thereby output a first comparison signal VL_OUT, and the second voltage comparison unit 422 compares the voltage level of the sawtooth waveform signal S_OUT with the second reference voltage VH_REF to thereby output a second comparison signal VH_OUT. Herein, the output forms of the first comparison signal VL_OUT and the second comparison signal VH_OUT may be different, e.g., an analog type or a digital type, according to the circuit structures of the first voltage comparison unit 421 and the second voltage comparison unit 422.

Subsequently, the driving current control block 430 generates a driving control signal CTR corresponding to the first comparison signal VL_OUT and the second comparison signal VH_OUT which are outputted from the voltage comparison block 420, and controls the driving current of the waveform generation block 410 with the driving control signal CTR. Herein, the voltage level of the driving control signal CTR may be varied based on the first comparison signal VL_OUT and the second comparison signal VH_OUT. In other words, the voltage level of the driving control signal CTR may be varied into a high voltage level in response to the first comparison signal VL_OUT, and it may be varied into a low voltage level in response to the second comparison signal VH_OUT.

In short, the waveform generation circuit fabricated in accordance with this example embodiment compares the voltage level of the sawtooth waveform signal S_OUT with the first reference voltage VL_REF and the second reference voltage VH_REF, varies the voltage level of the driving control signal CTR based on the comparison result, and thereby controls the driving current flowing through an current source IS of the waveform generation block 410. The driving current being controlled means that the amount of the driving current is changed, and this signifies that the slope of the sawtooth waveform signal S_OUT may be varied.

Figure 5:
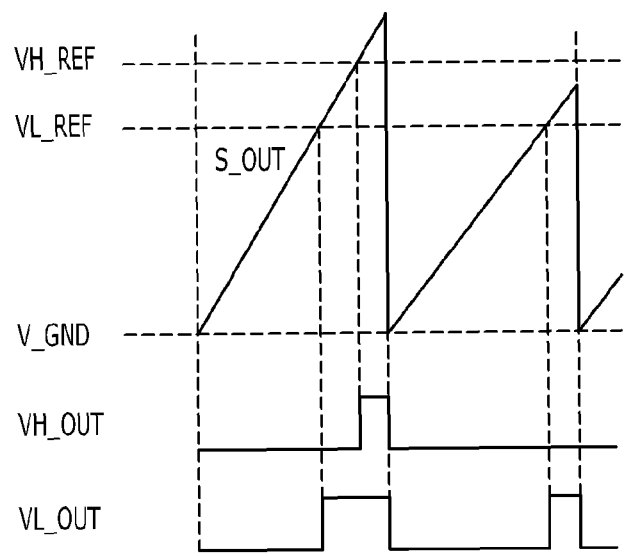
FIGS. 5 and 6 are waveform diagrams illustrating an example embodiment of brief operations of the waveform generation circuit illustrated in FIG. 4.
Figure 6:
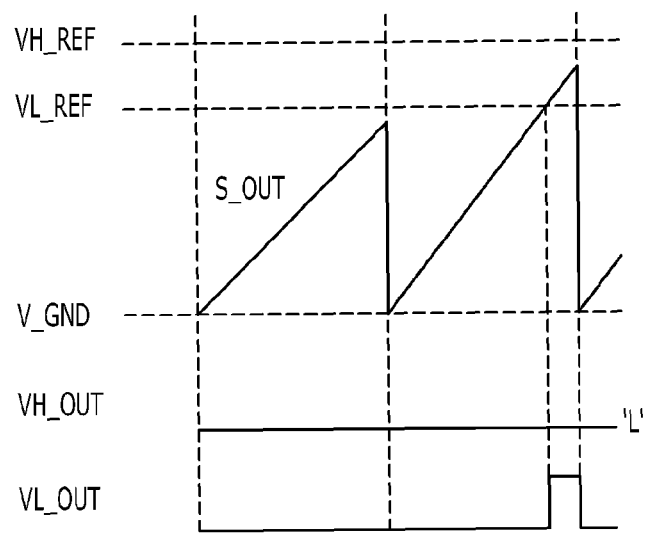

FIGS. 5 and 6 are waveform diagrams illustrating an example embodiment of brief operations of the waveform generation circuit illustrated in FIG. 4. Herein, the highest voltage level of the sawtooth waveform signal S_OUT after a compensation operation corresponds to a target voltage level. In other words, the first reference voltage VL_REF and the second reference voltage VH_REF already reflect an operation margin in their target voltage level. The first reference voltage VL_REF has a lower voltage level than the target voltage level, while the second reference voltage VH_REF has a higher voltage level than the target voltage level.

FIG. 5 is a waveform diagram illustrating an example embodiment of a brief operation of the waveform generation circuit illustrated in FIG. 4 when the slope of a sawtooth waveform signal S_OUT is greater than a target slope. Referring to FIG. 5, when the slope of the sawtooth waveform signal S_OUT is greater than the target slope, the highest voltage level of the sawtooth waveform signal S_OUT becomes higher than the target voltage level. In short, when the slope of the sawtooth waveform signal S_OUT is greater than the target slope, the voltage level is higher than the second reference voltage VH_REF. Herein, the first comparison signal VL_OUT and the second comparison signal VH_OUT come to have pulse width corresponding to the voltage level of the sawtooth waveform signal S_OUT based on the first reference voltage VL_REF and the second reference voltage VH_REF, respectively, and the driving current control block 430 generates a driving control signal CTR based on the first comparison signal VL_OUT and the second comparison signal VH_OUT with the pulse width. Subsequently, the driving current of the waveform generation block 410 is controlled based on the driving control signal CTR, and the sawtooth waveform signal S_OUT comes to have a slope corresponding to the target voltage level existing between the first reference voltage VL_REF and the second reference voltage VH_REF.

FIG. 6 is a waveform diagram illustrating an example embodiment of a brief operation of the waveform generation circuit illustrated in FIG. 4 when the slope of a sawtooth waveform signal S_OUT is smaller than a target slope. Referring to FIG. 6, when the slope of the sawtooth waveform signal S_OUT is smaller than the target slope, the highest voltage level of the sawtooth waveform signal S_OUT becomes lower than the target voltage level. In short, when the slope of the sawtooth waveform signal S_OUT is lower than the target slope, the voltage level is lower than the first reference voltage VL_REF. Herein, the first comparison signal VL_OUT comes to have pulse width corresponding to the first reference voltage VL_REF, and a driving control signal CTR is controlled accordingly. Subsequently, the driving current of the waveform generation block 410 is controlled based on the driving control signal CTR, and the sawtooth waveform signal S_OUT comes to have a slope corresponding to the target voltage level.

In other words, the current amount of the driving current is determined based on the first comparison signal VL_OUT and the second comparison signal VH_OUT. Subsequently, the voltage level of the sawtooth waveform signal S_OUT is determined based on the current amount of the driving current, and this signifies that the slope of the sawtooth waveform signal S_OUT is determined. After all, the waveform generation circuit fabricated in accordance with this example embodiment may maintain sawtooth waveform signals S_OUT of a uniform slope based on the target voltage level corresponding to the first reference voltage VL_REF and the second reference voltage VH_REF.

Figure 7:
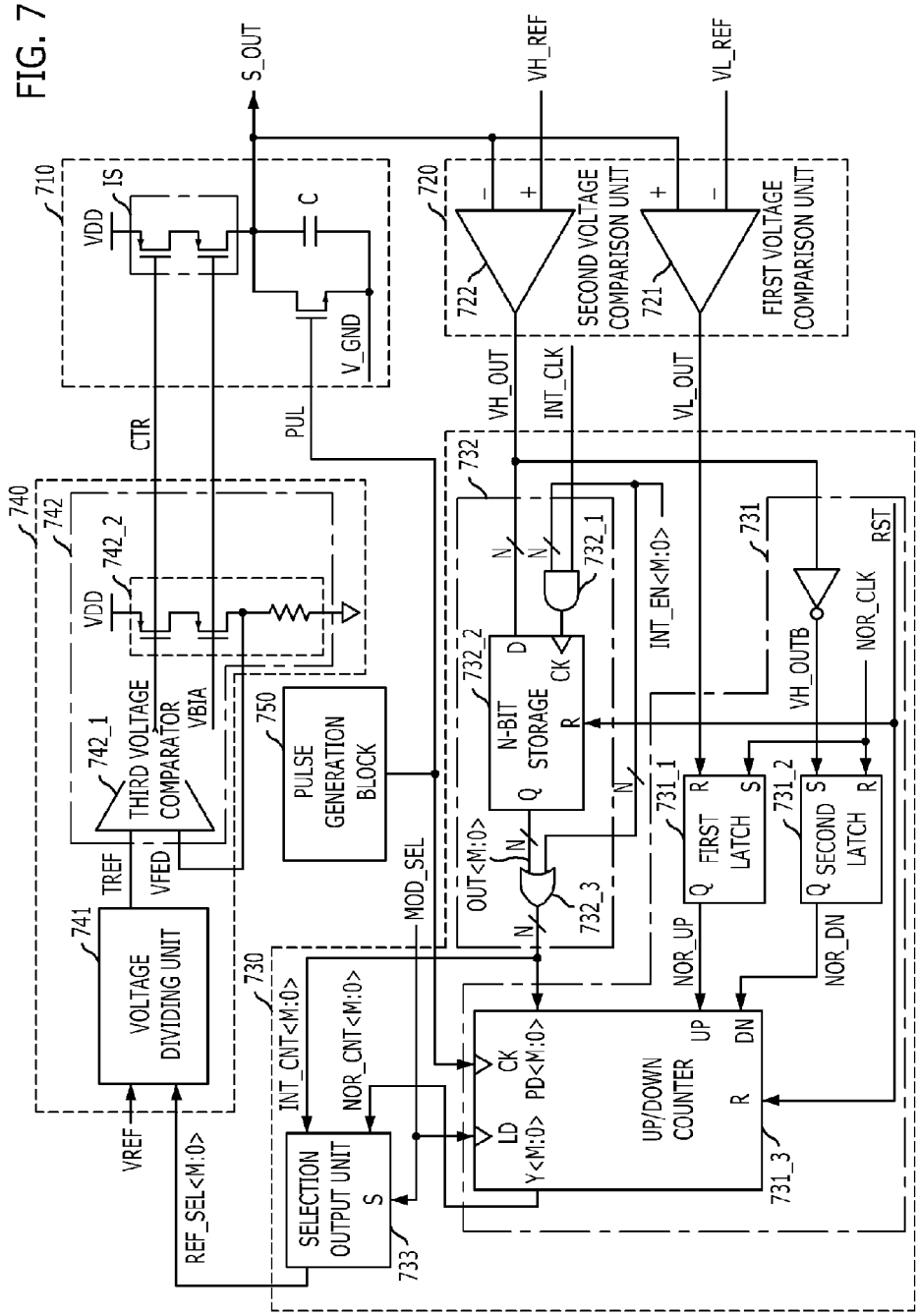
FIG. 7 is a circuit diagram illustrating yet another example embodiment of a waveform generation circuit.

FIG. 7 is a circuit diagram illustrating yet another example embodiment of a waveform generation circuit. The waveform generation circuit as illustrated in FIG. 7 includes a waveform generation block 710, a comparison signal generation block 720, a code signal generation block 730, a control signal generation block 740, and a pulse generation block 750. The waveform generation block 710 performs the same operation as the waveform generation blocks shown in FIGS. 3 and 4, and it generates a sawtooth waveform signal S_OUT based on a driving current in response to a driving control signal CTR. In this example embodiment of FIG. 7, the waveform generation block 710 performs different operations in the initial operation period and a normal operation period. Herein, the initial operation period is an operation period before the normal operation period. Although it will be described again later on, it is possible to quickly form a sawtooth waveform signal S_OUT in a desired waveform through a quick control operation in the initial operation period, and to continuously maintain the sawtooth waveform signal S_OUT formed in the desired waveform through a delicate control operation in the normal operation period.

The comparison signal generation block 720 compares the voltage level of the sawtooth waveform signal S_OUT with a first reference voltage VL_REF and a second reference voltage VH_REF which are defined corresponding to a target voltage level of the sawtooth waveform signal S_OUT and generates a first comparison signal VL_OUT and a second comparison signal VH_OUT. The comparison signal generation block 720 includes a first voltage comparison unit 721 and a second voltage comparison unit 722.

Herein, the first voltage comparison unit 721 compares the voltage level of the sawtooth waveform signal S_OUT with the first reference voltage VL_REF to thereby generate a first comparison signal VL_OUT, and the second voltage comparison unit 722 compares the voltage level of the sawtooth waveform signal S_OUT with the second reference voltage VH_REF, which is higher than the first reference voltage VL_REF, to thereby generate a second comparison signal VH_OUT. Herein, since the second reference voltage VH_REF is inputted into a positive (+) terminal of the second voltage comparison unit 722 in the second voltage comparison unit 722, the second comparison signal VH_OUT is outputted as a signal whose waveform is inverted to the waveform illustrated in FIGS. 5 and 6.

The code signal generation block 730 generates a code signal REF_SEL<M;0> (where M is a natural number) with a weight corresponding to the initial operation period or the normal operation period already reflected thereinto in response to the first comparison signal VL_OUT and the second comparison signal VH_OUT. The code signal generation block 730 includes a first counting unit 731, a second counting unit 732, and a selection output unit 733. The first counting unit 731 outputs a normal operation counting value NOR_CNT<M:0> through a counting operation with a first weight reflected thereinto in response to the first comparison signal VL_OUT in the normal operation period. The second counting unit 732 outputs an initial operation counting value INT_CNT<M:0> through a counting operation with a second weight reflected thereinto in response to the second comparison signal VH_OUT in the initial operation period. Herein, the second weight is greater than the first weight. For example, when a value is counted and there are two cases that the least counting unit is '1' and that the least counting unit is '5,' the least counting unit '1' becomes the first weight while the least counting unit '5' becomes the second weight. Subsequently, the selection output unit 733 outputs the initial operation counting value INT_CNT<M:0> and the normal operation counting value NOR_CNT<M:0> as a code signal REF_SEL<M:0> in the initial operation period and the normal operation period, respectively. The selection output unit 733 receives a mode selection signal MOD_SEL which is defined according to an initial operation period or a normal operation period. For example, when the mode selection signal MOD_SEL is a logic low, the initial operation counting value INT_CNT<M:0> is outputted as the code signal REF_SEL<M:0>. When the mode selection signal MOD_SEL is a logic high, the normal operation counting value NOR_CNT<M:0> is outputted as the code signal REF_SEL<M:0>.

Hereafter, blocks constituting the code signal generation block 730 will be described. First of all, the first counting unit 731 performs a counting operation with the first weight during a normal operation and it includes a first latch 731_1, a second latch 731_2, and an up/down counter 731_3.

The first latch 731_1 performs a set/reset operation in response to a normal clock signal NOR_CLK and the first comparison signal VL_OUT to thereby output an up counting signal NOR_UP, and the second latch 731_2 performs a set/reset operation in response to the normal clock signal NOR_CLK the second comparison signal VH_OUT to thereby output a down counting signal NOR_DOWN. The up/down counter 731_3 performs a counting operation onto the initial counting value which is defined by the output signal of the second counting unit 732 in response to the mode selection signal MOD_SEL to thereby output a normal operation counting value NOR_CNT<M:0>. Herein, the counting operation is performed based on the up counting signal NOR_UP and the down counting signal NOR_DOWN.

Subsequently, the second counting unit 732 performs a counting operation based on the second weight during the initial operation, and it includes an activator 732_1, an N-bit storage 732_2, and an output element 732_3.

The activator 732_1 outputs an enable signal INT_EN<M:0> to the N-bit storage 732_2 in response to the initial clock signal INT_CLK. The activator 732_1 may be formed of N AND gates receiving the enable signal INT_EN<M:0> and the initial clock signal INT_CLK, where N is a natural number and N=M+1. Herein, since the enable signal INT_EN<M: 0> is sequentially enabled, the output signal of the activator 732_1 is synchronized with the initial clock signal INT_CLK and sequentially becomes enabled. The N-bit storage 732_2 stores the second comparison signal VH_OUT in response to the output signal of the activator 732_1, and it may be formed of N flip-flops. The output element 732_3 receives an output signal of the N-bit storage 732_2 and outputs an initial operation counting value INT_CNT<M:0> in response to the enable signal INT_EN<M:0>. The output element 732_3 may be formed of N OR gates receiving the enable signal INT_EN<M:0> and the output signal of the N-bit storage 732_2.

Meanwhile, the control signal generation block 740 generates a driving control signal CTR of a voltage level corresponding to the code signal REF_SEL<M:0>, and it includes a voltage dividing unit 741 and a control signal output unit 742.

The voltage dividing unit 741 divides an internal reference voltage VREF into a plurality of divided voltages, and outputs a divided voltage corresponding to the code signal REF_SEL<M:0> among the plurality of divided voltages as a target reference voltage TREF. The control signal output unit 742 outputs a driving control signal CTR of a voltage level corresponding to the target reference voltage TREF.

Figure 8:
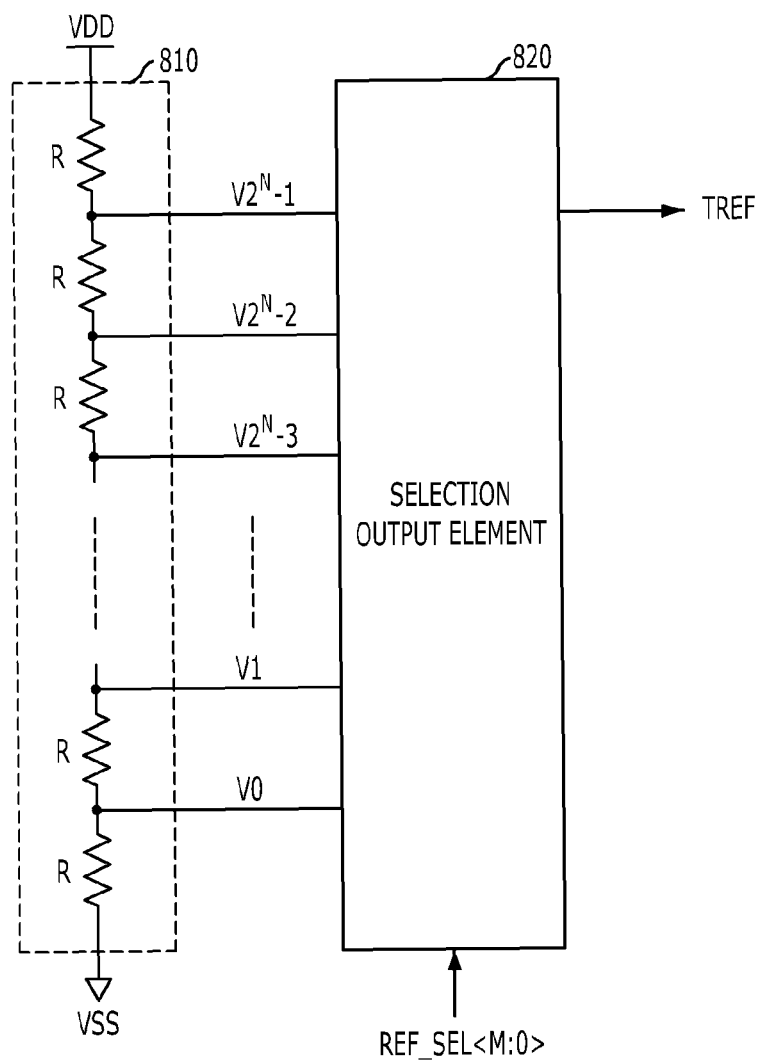
FIG. 8 is a diagram illustrating an example embodiment of a voltage dividing unit illustrated in FIG. 7.

FIG. 8 is a diagram illustrating an example embodiment of a voltage dividing unit 741 illustrated in FIG. 7. Referring to FIG. 8, the voltage dividing unit 741 includes a voltage divider 810 and a selection output element 820.

The voltage divider 810 divides an internal reference voltage VREF into a plurality of divided voltages V0, V1, ..., V$2^N$–1, and it may be formed of a plurality of resistors R serially connected between the internal reference voltage VREF and a ground voltage terminal VSS.

The selection output element 820 selects a divided voltage among the plurality of divided voltages V0, V1, ..., V$2^N$–1 based on the code signal REF_SEL<M:0> and outputs the selected divided voltage as a target reference voltage TREF. The selection output element 820 may be formed of decoders that may selectively output the plurality of divided voltages V0, V1, ..., V$2^N$–1 in response to N code signals REF_SEL<M:0> and a multiplexer (MUX).

Referring back to FIG. 7, the control signal output unit 742 of the control signal generation block 740 outputs a driving control signal CTR of a voltage level corresponding to the target reference voltage TREF, which is outputted from the voltage dividing unit 741. The control signal output unit 742 includes a third voltage comparator 742_1 and a feedback element 742_2.

The third voltage comparator 742_1 compares a feedback voltage VFED with the target reference voltage TREF to thereby generate a driving control signal CTR. The driving control signal CTR has a voltage level corresponding to a voltage level difference between the feedback voltage VFED and the target reference voltage TREF.

The feedback element 742_2 generates the feedback voltage VFED in response to the driving control signal CTR. The feedback element 742_2 may include NMOS transistors serially coupled and receiving the driving control signal CTR and a bias voltage VBIA through a gate and a resistor serially coupled with the NMOS transistors. Particularly, the NMOS transistors of the feedback element 742_2 may be formed of a replica circuit modeling the variable current generation unit IS of the waveform generation block 710.

Meanwhile, the pulse generation block 750 generates a pulse signal PUL enabled corresponding to a period of the sawtooth waveform signal S_OUT. The generated pulse signal PUL is also inputted to the up/down counter 731_3, which controls a counting operation in the normal operation period in response to the pulse signal PUL.

Figure 9:
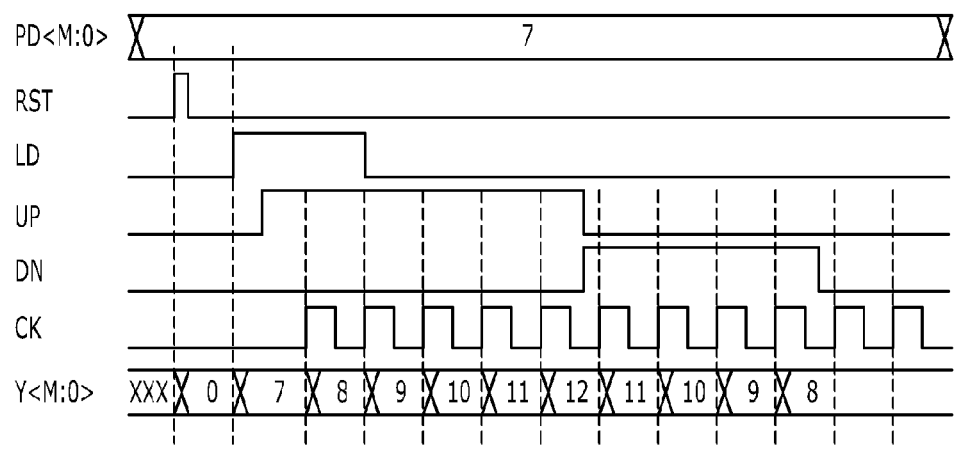
FIG. 9 is a timing diagram illustrating an example embodiment of a circuit operation of an up/down counter illustrated in FIG. 7.

FIG. 9 is a timing diagram illustrating an example embodiment of a circuit operation of an up/down counter 731_3 illustrated in FIG. 7. For the sake of convenience in description, it is assumed that the initial counting value outputted from the second counting unit 732 is '7'.

Referring to FIGS. 7 and 9, the up/down counter 731_3 is reset in response to a reset signal RST, and the normal operation counting value NOR_CNT<M:0> outputted from the output element Y<M:0> is reset at '0'. Subsequently, the up/down counter 731_3 loads the initial counting value '7' in response to the mode selection signal MOD_SEL which is inputted to a loading control terminal LD, and performs an up counting operation or a down counting operation based on an up counting signal NOR_UP, a down counting signal NOR_DN, and the pulse signal PUL inputted to an up counting control terminal UP, a down counting control terminal DN, and a clock input terminal CK, respectively. In other words, the normal operation counting value NOR_CNT<M:0> is increased according to the up counting operation, and decreased according to the down counting operation. The first weight described before signifies a variation value of the normal operation counting value NOR_CNT<M:0>.

Meanwhile, one example embodiment includes an initial operation period and a normal operation period. In the initial operation period, a counting operation is performed based on a second weight in order to quickly generate a desired sawtooth waveform signal S_OUT. On the other hand, in the normal operation period, a counting operation is performed based on a first weight in order to uniformly maintain the generated sawtooth waveform signal S_OUT.

Figure 10:
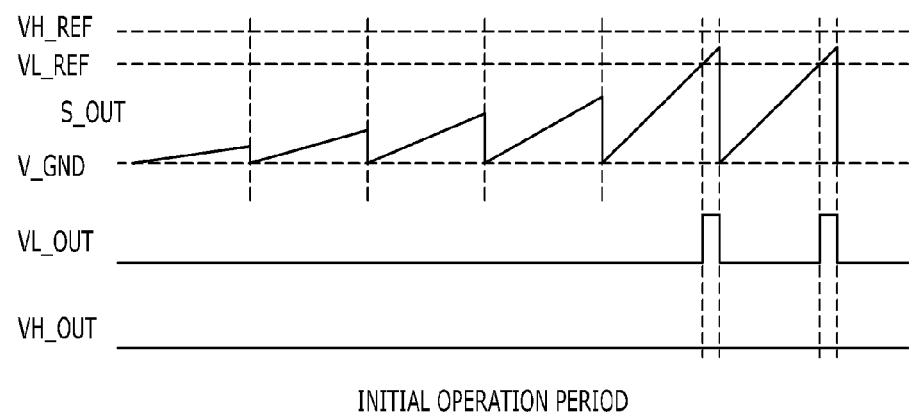
FIG. 10 is a waveform diagram illustrating an example embodiment of a counting operation in the initial operation period and a normal operation period of the waveform generation circuit illustrated in FIG. 7.
Figure 10:
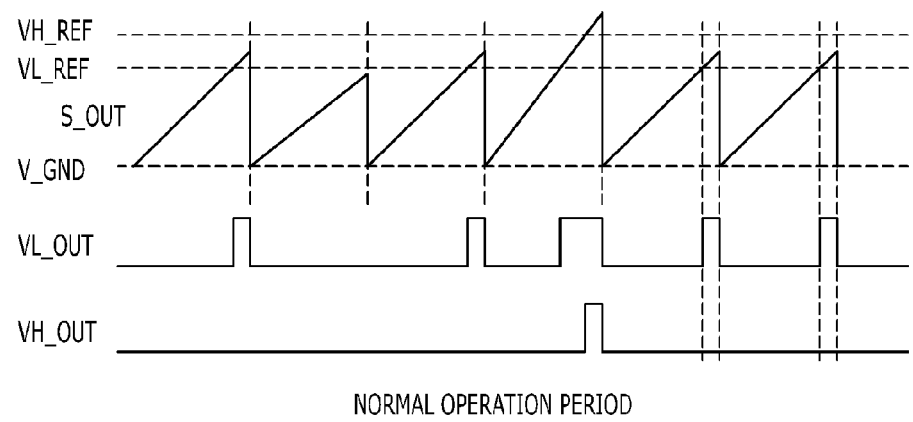

FIG. 10 is a waveform diagram illustrating an example embodiment of a counting operation in the initial operation period and a normal operation period of the waveform generation circuit illustrated in FIG. 7. Herein, it is assumed that when a sawtooth waveform signal S_OUT has a voltage level between a first reference voltage VL_REF and a second reference voltage VH_REF at a predetermined time, a sawtooth waveform signal S_OUT of a desired waveform is generated. In other words, it is regarded that when the highest voltage level of a sawtooth waveform signal S_OUT is between the first reference voltage VL_REF and the second reference voltage VH_REF, a sawtooth waveform signal S_OUT of a desired waveform is generated. Herein, the second reference voltage VH_REF is illustrated to correspond to FIGS. 5 and 6.

Referring to FIGS. 7 and 10, in the initial operation period, control is performed to quickly form a slope targeted by the sawtooth waveform signal S_OUT based on the second weight. As illustrated in the drawing, the initial slope of the sawtooth waveform signal S_OUT is quickly increased to thereby generate the desired slope waveform. In the example embodiment, a change occurring during a process is reflected into the sawtooth waveform signal S_OUT during the initial operation period to thereby quickly correct the slope.

Subsequently, in the normal operation period, control is performed to maintain the sawtooth waveform signal S_OUT of a desired waveform based on the first weight in the normal operation period. As illustrated in the drawing, when the waveform of the sawtooth waveform signal S_OUT goes out of the desired waveform, that is, when the highest voltage level of the sawtooth waveform signal S_OUT is lower than the first reference voltage VL_REF, or when the highest voltage level of the sawtooth waveform signal S_OUT is higher than the second reference voltage VH_REF, control is performed delicately to thereby maintain the sawtooth waveform signal S_OUT in the desired waveform. In this example embodiment, a change according to temperature, voltage and the like is reflected into the sawtooth waveform signal S_OUT in the normal operation period and the slope of the sawtooth waveform signal S_OUT is delicately corrected.

Figure 11:
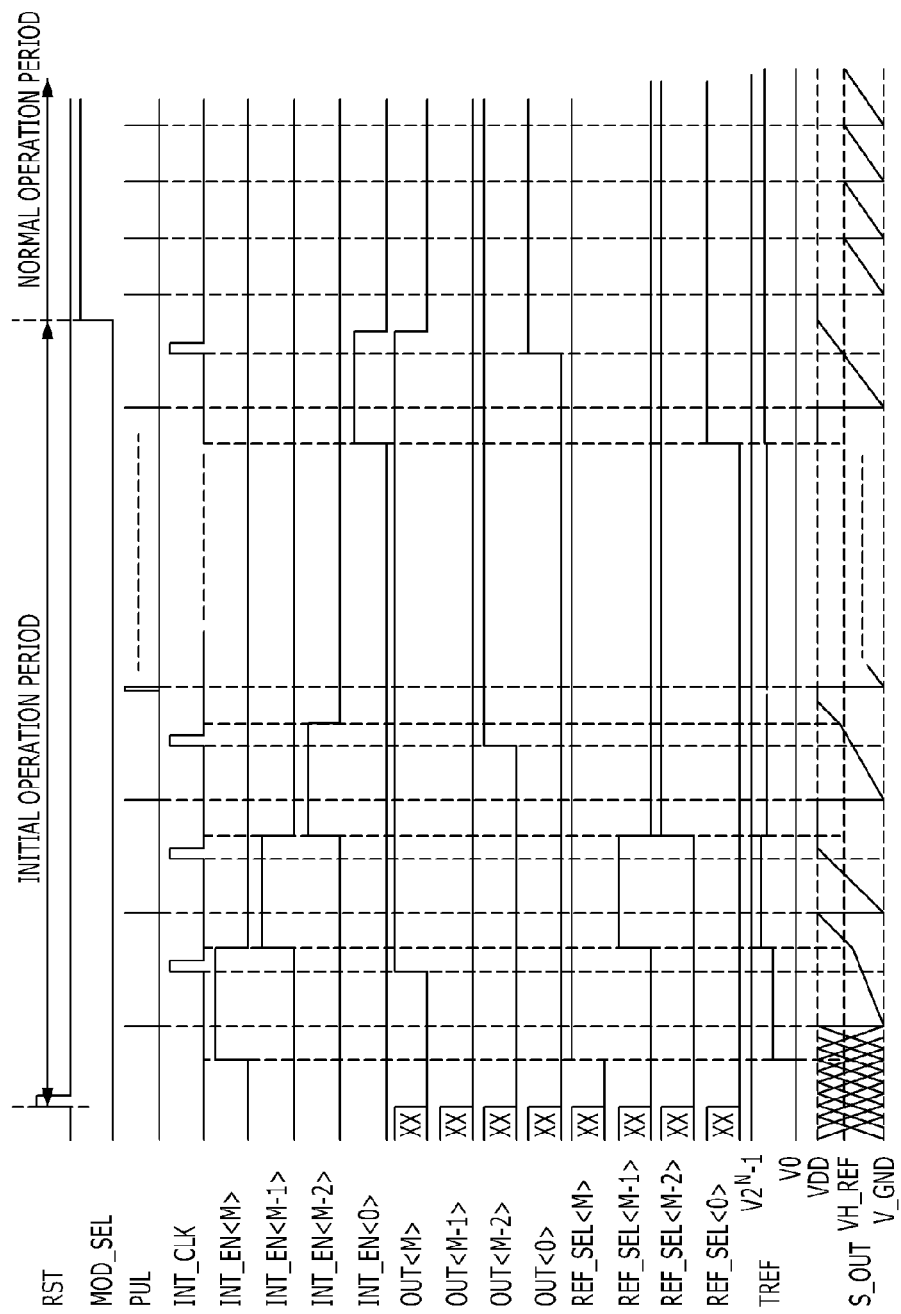
FIG. 11 is a substantial timing diagram illustrating an example embodiment of the initial operation period according to the structure illustrated in FIG. 7.

FIG. 11 is a substantial timing diagram illustrating an example embodiment of the initial operation period according to the structure illustrated in FIG. 7. Herein, the initial operation period is defined as a period where the mode selection signal MOD_SEL is logic low.

Referring to FIGS. 7 and 11, the N-bit storage 732_2 is reset in response to a reset signal RST. Subsequently, the N-bit storage 732_2 sequentially stores second comparison signals VH_OUT based on the enable signals INT_EN<M:0> sequentially enabled and the initial clock signal INT_CLK. The stored values become the output signals OUT<M:0> of the N-bit storage 732_2. Herein, an output signal OUT<M:0> of the N-bit storage 732_2 is determined based on the voltage level of the sawtooth waveform signal S_OUT and the second reference voltage VH_REF. For example, when the voltage level of the sawtooth waveform signal S_OUT is lower than the second reference voltage VH_REF (①and ③), an output signal OUT<M> and an output signal OUT<M−2> are outputted to be logic high among the output signals OUT<M:0> of the N-bit storage 732_2. When the voltage level of the sawtooth waveform signal S_OUT is higher than the second reference voltage VH_REF (②), an output signal OUT<M−1> is outputted to be logic low among the output signals OUT<M:0> of the N-bit storage 732_2. Through this process, the code value of the code signal REF_SEL<M:0> is sequentially determined and after all, it is possible to quickly form a desired waveform ④ for the sawtooth waveform signal S_OUT.

Herein, when it is assumed that the output signal OUT<M:0> of the N-bit storage 732_2 is a code, it may be considered that the output signal OUT<M:0> performs a counting operation while changing the digit number based on the enable signal INT_EN<M:0> which is sequentially enabled. This counting operation is performed based on the second weight.

Meanwhile, the output signals OUT<M:0> of the N-bit storage 732_2 which is generated through the counting operation is outputted as an initial operation counting value INT_CNT<M:0>, and it is outputted as a code signal REF_SEL<M:0> through the selection output unit 733. Subsequently, the target reference voltage TREF has a voltage level corresponding to the code signal REF_SEL<M:0>, and the slope of the sawtooth waveform signal S_OUT is controlled based on the driving control signal CTR corresponding to the target reference voltage TREF. To sum up, the waveform generation circuit fabricated according to an example embodiment may quickly generate the sawtooth waveform signal S_OUT of the waveform ④ based on the code signal OUT<M:0> finally outputted in the initial operation period.

Figure 12:
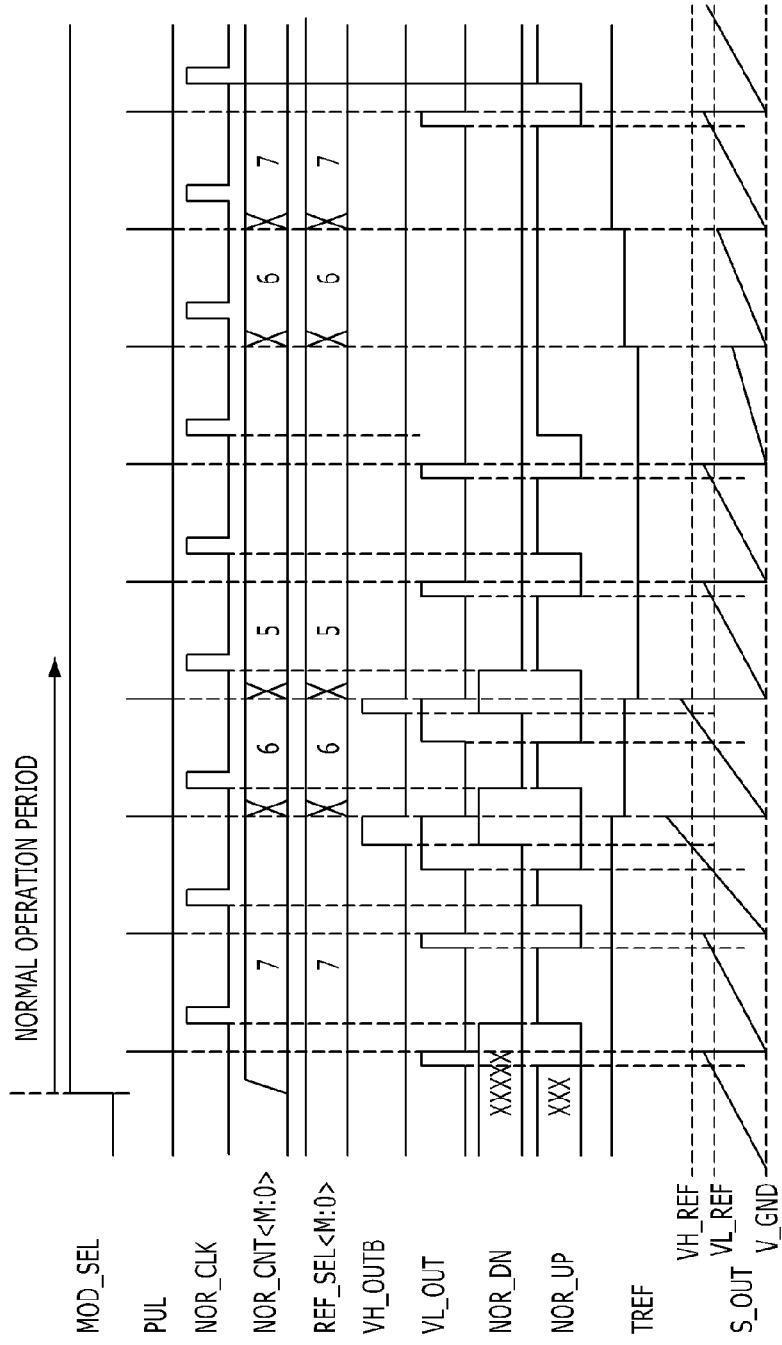
FIG. 12 is a timing diagram illustrating an example embodiment of a normal operation period according to the structure illustrated in FIG. 7.

FIG. 12 is a timing diagram illustrating an example embodiment of a normal operation period according to the structure illustrated in FIG. 7. Herein, a normal operation period is defined as a period where the mode selection signal MOD_SEL is logic high. In the normal operation period after the initial operation period, a counting operation is performed by using the code signal OUT<M:0> finally outputted in the initial operation period as an initial counting value. Herein, a signal VH_OUTB obtained by inverting the second comparison signal VH_OUT will be still referred to as the same name, which is a second comparison signal VH_OUTB, for the sake of convenience in description.

First, the first latch 731_1 and the second latch 731_2 perform a set/reset operation in response to a first comparison signal VL_OUT, a second comparison signal VH_OUTB, and a normal clock signal NOR_CLK to thereby generates an up counting signal NOR_UP and a down counting signal NOR_DN. Subsequently, the up/down counter 731_3 performs a counting operation onto the initial counting value in response to the up counting signal NOR_UP and the down counting signal NOR_DN. Herein, it is assumed for the sake of convenience that the initial counting value is '7'. For example, the up counting operation or the down counting operation are performed on the normal operation counting value NOR_CNT<M:0> outputted from the up/down counter 731_3 from the initial counting value '7'. The normal operation counting value NOR_CNT<M:0> is outputted as the code signal REF_SEL<M:0> through the selection output unit 733. The target reference voltage TREF has a voltage level corresponding to the code signal REF_SEL<M:0>, and the slope of the sawtooth waveform signal S_OUT is controlled based on the driving control signal CTR which corresponds to the target reference voltage TREF. In short, the waveform generation circuit fabricated according to an example embodiment may perform a control to make the voltage level of the sawtooth waveform signal S_OUT fall between the first reference voltage VL_REF and the second reference voltage VH_REF.

Figure 13:
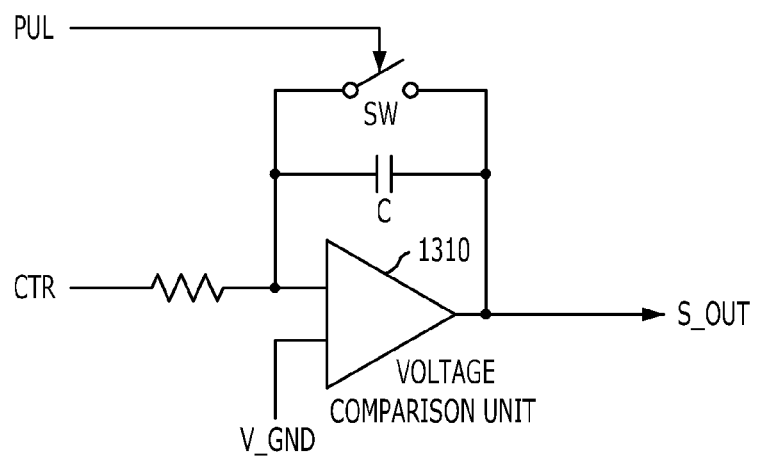
FIG. 13 is a schematic diagram illustrating an example embodiment of a waveform generation block shown in FIG. 7.

FIG. 13 is a schematic diagram illustrating an example embodiment of a waveform generation block 710 shown in FIG. 7. Referring to FIG. 13, the waveform generation block includes a resistor R for receiving a driving control signal CTR, a voltage comparison unit 1310 having one input coupled to resistor R, one input connected to a discharge terminal V_GND and an output generating a sawtooth waveform signal S_OUT, a charging unit C coupled between the resistor R and an output terminal of the voltage comparison unit 1310, and a switching unit SW coupled with the charging unit C in parallel. Voltage comparison unit 1310 compares the voltage values at its inputs to generate the sawtooth waveform signal S_OUT as charging unit C charges. Herein, the switching unit SW performs a switching operation in response to a pulse signal PUL which is the same as the pulse signal PUL shown in FIG. 7. Just as in the example embodiment illustrated in FIG. 7, the sawtooth waveform signal S_OUT is generated corresponding to the period of the pulse signal PUL in the embodiment shown in FIG. 13. The slope of the generated sawtooth waveform signal S_OUT is also defined by the voltage level of the driving control signal CTR.

The waveform generation circuit fabricated according to an example embodiment, according to the teachings above, may compensate a waveform signal for environmental factors that are reflected into a circuit. In addition, in order to efficiently control the compensation operation, a counting operation is performed using a different weight in the initial operation period and the normal operation period, individually. Through this process, the time taken for generating and maintaining a waveform signal of a desired waveform may be minimized.

According to an example embodiment, it is possible to generate waveform signals of a uniform waveform all the time although environmental factors reflected into a circuit may be changed.

Also, the technology of an example embodiment may minimize the time taken for generating and maintaining waveform signals of a desired waveform.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A waveform generation circuit, comprising:
a waveform generation block configured to generate a waveform signal corresponding to a driving control signal, the waveform generation block comprising a variable current generation unit configured to generate a current corresponding to the driving control signal, and the variable current generation unit comprising a current source connected between a power source voltage terminal and an output terminal configured to output the waveform signal; and
a control signal generation block configured to
divide an internal reference voltage into a plurality of divided voltages,
select one of the divided voltages based on comparisons of a voltage level of the waveform signal with reference voltages configured to define target voltage levels of the waveform signal, and
generate the driving control signal according the one of the divided voltages.

2. The waveform generation circuit of claim 1, wherein the control signal generation block receives feedback from the waveform signal.

3. The waveform generation circuit of claim 1, wherein the waveform signal comprises a slope corresponding to the driving control signal.

4. The waveform generation circuit of claim 1, wherein the waveform signal comprises a sawtooth waveform.

5. The waveform generation circuit of claim 1, wherein the waveform generation block further comprises:
a charging unit configured to be charged with the generated current; and
a discharging unit configured to discharge the charging unit.

6. The waveform generation circuit of claim 1, further comprising:
a comparison signal generation block configured to
compare the voltage level of the waveform signal with the reference voltages configured to define the target voltage levels of the waveform signal, and
generate comparison signals respectively corresponding to the comparisons of the voltage level of the waveform signal with the reference voltages, the control signal generation block being configured to generate the driving control signal based on the generated comparison signals.

7. The waveform generation circuit of claim 1, further comprising:
a pulse generation block configured to
generate a pulse signal enabled corresponding to a period of the waveform signal, and
input the generated pulse signal into the waveform generation block.

8. A waveform generation circuit, comprising:
a waveform generation block configured to generate a waveform signal corresponding to a driving control signal; and
a control signal generation block configured to
divide an internal reference voltage into a plurality of divided voltages,
select one of the divided voltages based on comparisons of a voltage level of the waveform signal with reference voltages configured to define target voltage levels of the waveform signal, and
generate the driving control signal according to the one of the divided voltages.

9. The waveform generation circuit of claim 8, further comprising:
a comparison signal generation block configure to generate comparison signals from the comparisons of the voltage level of the waveform signal with the reference voltages, the control signal generation block being configured to generate the driving control signal based on the generated comparison signals.

10. A waveform generation circuit, comprising:
a waveform generation block configured to generate a waveform signal corresponding to a driving control signal; and
a control signal generation block configured to generate the driving control signal based on comparisons of a voltage level of the waveform signal with reference voltages configured to define target voltage levels of the waveform signal,
wherein the control signal generation block comprises a voltage dividing unit configured to divide an internal reference voltage into a plurality of divide voltages and select one of the divided voltage based on the comparisons of the voltage level of the waveform signal with the reference voltages, and a control signal output unit configured to generate the driving control signal according to the one of the divided voltages.

11. The waveform generation circuit of claim 10, further comprising:
a comparison signal generation block configure to generate comparison signals from the comparisons of the voltage level of the waveform signal with the reference voltages, the control signal generation block being further-configured to generate the driving control signal based on the generated comparison signals.

* * * * *